(12) United States Patent
Soma

(10) Patent No.: US 8,289,778 B2
(45) Date of Patent: Oct. 16, 2012

(54) DATA PROCESSING DEVICE AND METHOD OF READING TRIMMING DATA

(75) Inventor: Yoshitaka Soma, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 1054 days.

(21) Appl. No.: 12/230,801

(22) Filed: Sep. 4, 2008

(65) Prior Publication Data

US 2009/0323440 A1    Dec. 31, 2009

(30) Foreign Application Priority Data

Jun. 30, 2008    (JP) ................... 2008-171292

(51) Int. Cl.
*G11C 11/34*    (2006.01)

(52) U.S. Cl. ............... 365/185.2; 365/189.15; 365/210.1

(58) Field of Classification Search ................ 365/185.2, 365/185.24, 189.15, 210.1
See application file for complete search history.

(56) References Cited

U.S. PATENT DOCUMENTS

| | | | | |
|---|---|---|---|---|
| 5,793,674 A | * | 8/1998 | Kubo et al. | ............... 365/185.09 |
| 7,280,409 B2 | * | 10/2007 | Misumi et al. | ........... 365/185.28 |
| 7,440,330 B2 | * | 10/2008 | Noichi | ........................ 365/185.2 |
| 7,551,488 B2 | * | 6/2009 | Tanikawa et al. | ........ 365/185.22 |
| 2005/0057972 A1 | | 3/2005 | Taito et al. | |
| 2007/0189078 A1 | | 8/2007 | Taito et al. | |
| 2008/0043537 A1 | | 2/2008 | Tanikawa et al. | |

FOREIGN PATENT DOCUMENTS

| | | |
|---|---|---|
| JP | 5-225072 | 9/1993 |
| JP | 2005-116145 | 4/2005 |
| JP | 2008-47209 | 2/2008 |

OTHER PUBLICATIONS

Japanese Office Action dated Sep. 4, 2009, with partial English translation.

* cited by examiner

*Primary Examiner* — Alexander Sofocleous
(74) *Attorney, Agent, or Firm* — McGinn IP Law Group, PLLC

(57) ABSTRACT

A data processing device according to the present invention comprises a nonvolatile memory and a trimming data read control circuit. The nonvolatile memory has a plurality of memory regions in which the same trimming data is stored. The trimming data read control circuit reads the trimming data from a random one of the plurality of memory regions.

14 Claims, 16 Drawing Sheets

1: DATA PROCESSING DEVICE

DATA PROCESSING DEVICE AND METHOD OF READING TRIMMING DATA

INCORPORATION BY REFERENCE

This application is based upon and claims the benefit of priority from Japanese patent application No. 2008-171292, filed on Jun. 30, 2008, the disclosure of which is incorporated herein in its entirely by reference.

BACKGROUND OF THE INVENTION

1. Field of the Invention

The present invention relates to a technique of reading a trimming data used for trimming circuit characteristics. In particular, the present invention relates to a technique of reading the trimming data stored in a nonvolatile memory.

2. Description of Related Art

A nonvolatile memory such as a flash memory and an EEPROM (Electrically Erasable and Programmable Read Only Memory) is known. A memory cell of such a nonvolatile memory has a charge storage layer such as a floating gate. Data writing/erasing is performed by injecting electrons into the charge storage layer or drawing electrons out of the charge storage layer. A relatively high voltage is required in the data writing/erasing, and the high voltage is generated by a charge pump or the like. A reference voltage, which is used for generating the high voltage, is likely to vary with respect to each chip due to manufacturing variability. Also, at a time of data reading, a data stored in a read-target cell is sensed by comparing a cell current flowed from the read-target cell with a predetermined reference current. The reference current also is likely to vary with respect to each chip due to manufacturing variability.

As described above, the manufacturing variability between chips causes the variations of the output voltage of the charge pump and the reference current that is referred to at the time of data reading, which consequently leads to variations of write characteristics and read characteristics. In order to suppress the characteristic variations, it is necessary after manufacture of chips to fine-tune the output voltage of the charge pump and the reference current with respect to each chip. The fine-tuning is called "trimming".

As a result of the trimming, the output voltage of the charge pump and the reference current are respectively set to optimum values. A data indicating the optimum setting is referred to as a "trimming data" hereinafter. The trimming data is determined with respect to each chip at a test stage after the manufacture of chips, and the determined trimming data is stored in a predetermined memory region. At the power-on, the trimming data is read from the predetermined memory region, and the trimming of circuit characteristics is performed by using the read trimming data. That is, the output voltage of the charge pump and the reference current are respectively adjusted (trimmed) to the optimum values by using the read trimming data.

The trimming data related to the circuit characteristics of the nonvolatile memory may be stored in a memory region of the nonvolatile memory itself. Such a memory region for use in storing the trimming data is referred to as an "EXTRA region" hereinafter. Data types and access addresses for the EXTRA region are fixed, and data once stored in the EXTRA region are not rewritten. At the power-on, the trimming data is first read from the EXTRA region, and then the trimming of circuit characteristics is performed based on the read trimming data.

Note that the reading of the trimming data from the EXTRA region is naturally prior to the trimming of the circuit characteristics. That is to say, the trimming data is not necessarily read out under the optimum circuit characteristics. In other words, read accuracy of the trimming data itself is not necessarily high.

Japanese Laid-Open Patent Application JP-2008-47209 discloses a technique related to the trimming. According to the technique, the same trimming data is stored in two trimming redundancy information storage memory regions. At the power-on, the trimming data are respectively read from the two trimming redundancy information storage memory regions. Then, a sequence circuit determines validity of the read trimming data based on a check sum method or the like. If a positive result is obtained, the read trimming data is adopted. Consequently, the read accuracy of the trimming data is improved.

The inventor of the present application has recognized the following points. A problem peculiar to data read from the nonvolatile memory is "read disturb". The read disturb means that weak data writing is caused every data reading and thereby data characteristics of a memory cell are varied. In the worst case, a stored data in the memory cell is changed.

As described above, the trimming data is essential for obtaining the optimum circuit characteristics and is always read from the EXTRA region at every power-on procedure. Therefore, it can be said that the trimming data (EXTRA region) is susceptible to the read disturb. The change in data characteristics of the EXTRA region caused by the read disturb leads to read errors such as erroneous reading of the trimming data, which consequently deteriorates the circuit characteristics.

In order to suppress the erroneous reading of the trimming data, for example, a difference (margin) between the cell current and the reference current may be expanded in consideration of variation of the cell current caused by the read disturb. To that end, it is necessary to design a circuit configuration such that a larger cell current can flow. However, this causes increase in a circuit size and power consumption.

SUMMARY

In a first aspect of the present invention, a data processing device is provided. The data processing device comprises a nonvolatile memory and a trimming data read control circuit. The nonvolatile memory has a plurality of memory regions in which the same trimming data is stored. The trimming data read control circuit reads the trimming data from a random one of the plurality of memory regions.

In a second aspect of the present invention, a method of reading a trimming data is provided. The method includes: providing a nonvolatile memory having a plurality of memory regions in which a same trimming data is stored; and reading the trimming data from a random one of the plurality of memory regions.

According to the present invention, the trimming data is read from a random one of the plurality of memory regions. In other words, a frequency that the trimming data is read out from is decreased with regard to one memory region. Since the frequency of access to each memory region is decreased, the influence of the read disturb on each memory region is reduced. As a result, the change in data characteristics caused by the read disturb is suppressed and hence read errors such as erroneous reading of the trimming data can be prevented.

That is to say, the read accuracy of the trimming data is improved and thus the circuit characteristics also are improved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Outline

Figure 1:
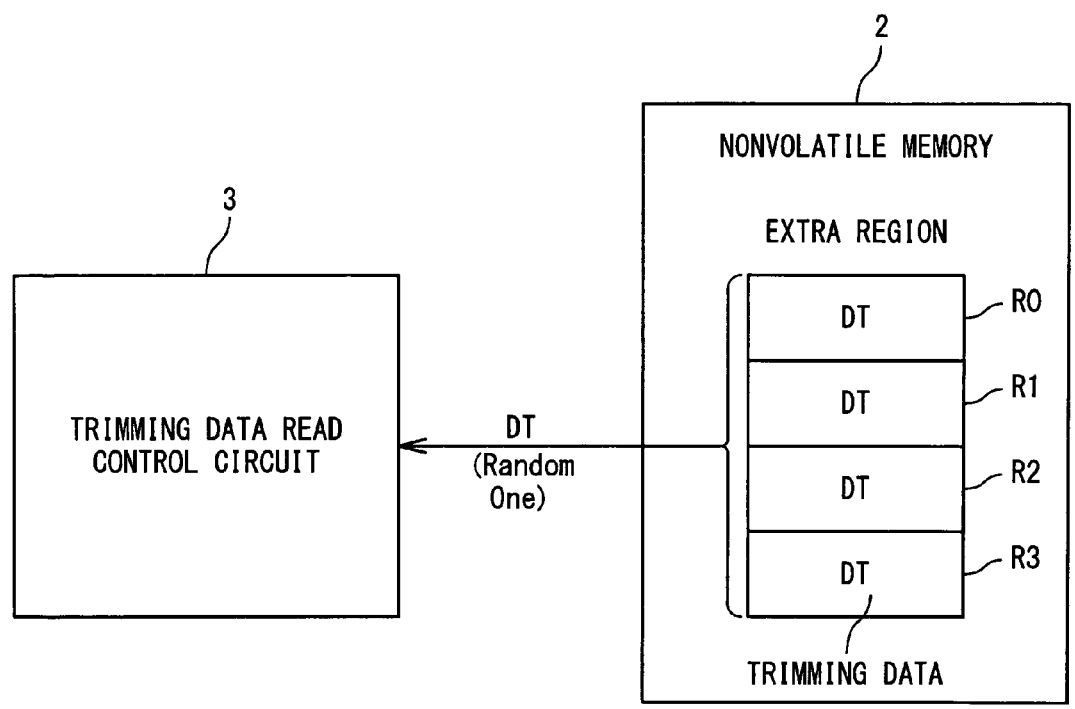
FIG. 1 is a block diagram schematically showing a configuration of a data processing device according to an embodiment of the present invention.

FIG. 1 schematically shows a configuration of a data processing device 1 according to an embodiment of the present invention. The data processing device 1 is provided with a nonvolatile memory 2 and a trimming data read control circuit 3.

The nonvolatile memory 2 has a memory cell array in which a plurality of memory cells are arranged in an array. More specifically, the memory cell array has a plurality of word lines and a plurality of bit lines that are formed to intersect with each other, and the plurality of memory cells are arranged at respective intersections of the word lines and the bit lines. The nonvolatile memory 2 is a semiconductor memory such as a flash memory and an EEPROM, for example. In this case, each memory cell comprises a memory cell transistor having a floating gate (charge storage layer) and a control gate. The control gate is electrically connected to one word line, and source/drain of the memory cell transistor are electrically connected to bit lines. Data writing/erasing with respect to the memory cell is performed by injecting electrons into the charge storage layer or drawing electrons out of the charge storage layer.

A trimming data DT related to circuit characteristics of the nonvolatile memory 2 is determined with respect to each chip at a test stage after manufacture of chips. Then, the determined trimming data DT is stored in a predetermined memory region in the memory cell array of the nonvolatile memory 2. The predetermined memory region in which the trimming data DT is stored is the "EXTRA region". According to the present embodiment, a plurality of EXTRA regions are provided and used for storing the trimming data DT. The same trimming data DT is stored in the plurality of EXTRA regions. In FIG. 1, for example, the nonvolatile memory 2 has four EXTRA regions R0 to R3 in which the same trimming data DT is stored.

At the power-on of the data processing device 1, the trimming of the circuit characteristics of the nonvolatile memory 2 is performed based on the above-mentioned trimming data DT. A circuit for controlling the trimming processing is the trimming data read control circuit 3. The trimming data read control circuit 3 may be inside or outside of the nonvolatile memory 2 or can share a part of circuits with the nonvolatile memory 2.

The trimming data read control circuit 3 reads the trimming data DT from an EXTRA region in the nonvolatile memory 2. In particular, the trimming data read control circuit 3 "randomly" selects one EXTRA region from the above-mentioned plurality of EXTRA regions R0 to R3 and reads the trimming data DT from the random one EXTRA region. In other words, an EXTRA region from which the trimming data DT is read out at the power-on, which is referred to as a "target EXTRA region" hereinafter, is not fixed. The target EXTRA region is selected in a random manner and can differ at every power-on. Then, the circuit characteristics are adjusted (trimmed) to optimum values by using the trimming data DT read out from the target EXTRA region.

According to the present embodiment, as described above, the trimming data DT is read from a random one of the plurality of EXTRA regions R0 to R3. In other words, a frequency that the trimming data DT is read out from is decreased with regard to a certain one EXTRA region. When the reading of the trimming data DT is performed for a large number of times, probability that any one of the EXTRA regions R0 to R3 is selected as the target EXTRA region becomes approximately 1/4. Since the frequency of access to each EXTRA region is decreased, the influence of the read disturb on each EXTRA region is reduced. As a result, the change in data characteristics caused by the read disturb is suppressed and hence read errors such as erroneous reading of the trimming data DT can be prevented. That is to say, the read accuracy of the trimming data DT is improved and thus the circuit characteristics also are improved.

In order to suppress the erroneous reading of the trimming data DT, for example, a difference (margin) between a cell current and a reference current may be expanded in consideration of variation of the cell current caused by the read disturb. To that end, it is necessary to design a circuit configuration such that a larger cell current can flow. However, this causes increase in a circuit size and power consumption. According to the present embodiment, it is not necessary to set the large margin because the variation of data characteristics caused by the read disturb is suppressed. Consequently, the increase in the circuit size and power consumption can be prevented.

It should be noted that at a time of data reading from a selected memory cell, a word line and a bit line connected to the selected memory cell are selected. Then, a relatively high read word voltage is applied to the selected word line. Here, memory cells other than the selected memory cell are also connected to the selected word line. Therefore, the read word voltage applied to the selected word line can affect data characteristics of the memory cells other than the selected memory cell. It is therefore preferable that the above-mentioned EXTRA regions R0 to R3 are connected to different word lines, respectively.

Figure 2:
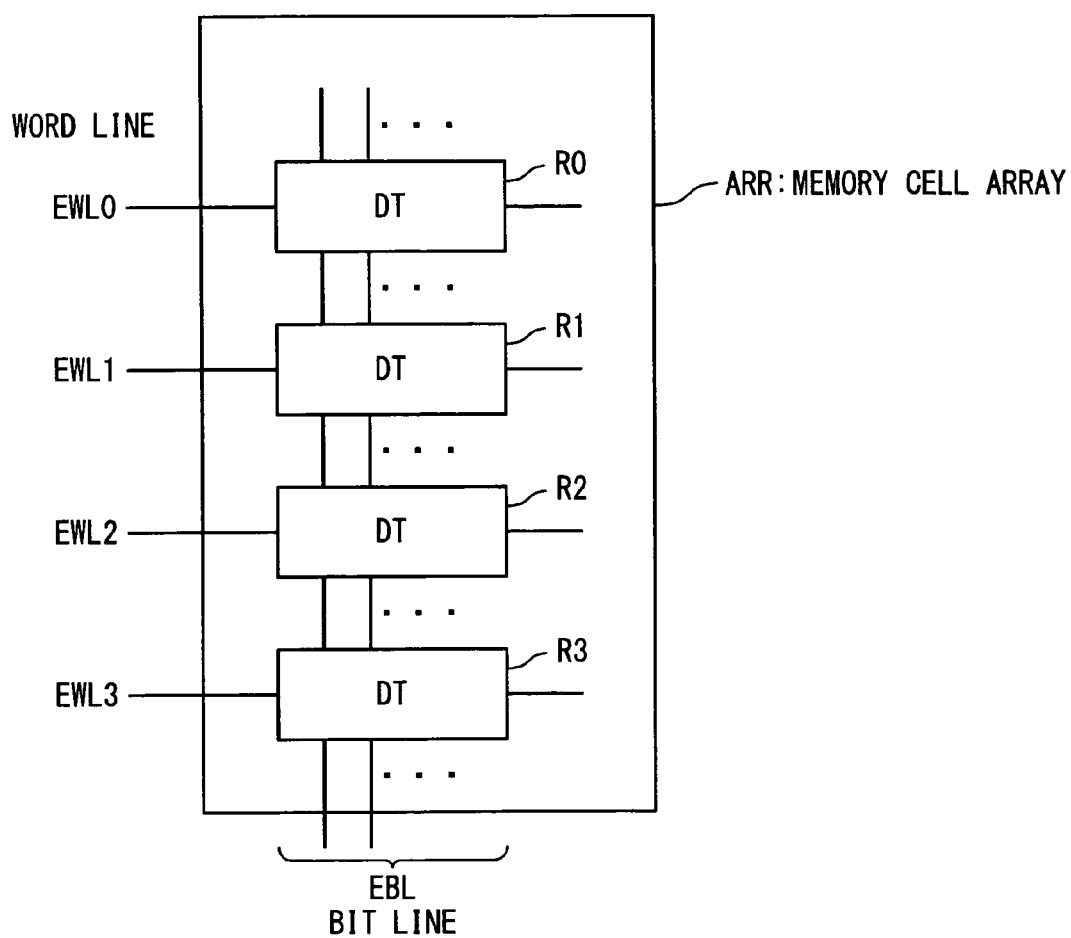
FIG. 2 is a schematic diagram showing one example of a placement of EXTRA regions in the present embodiment.

FIG. 2 shows one example of a placement of the EXTRA regions R0 to R3 in the memory cell array ARR of the non-volatile memory 2. In the example shown in FIG. 2, the EXTRA regions R0 to R3 are connected to different word lines EWL0 to EWL3, respectively. Also, the EXTRA regions R0 to R3 are connected to the same bit line group EBL. At the time of the reading of the trimming data DT from the target EXTRA region, a word line connected to the target EXTRA region is selected and driven. In other words, one of the plurality of word lines EWL0 to EWL3 is randomly selected, and the read word voltage is applied only to the selected word line. Thus, the read word voltage applied to the selected word line does not affect data characteristics of EXTRA regions other than the target EXTRA region. As a result, the influence of the read disturb is further suppressed, which is preferable.

Figure 3:
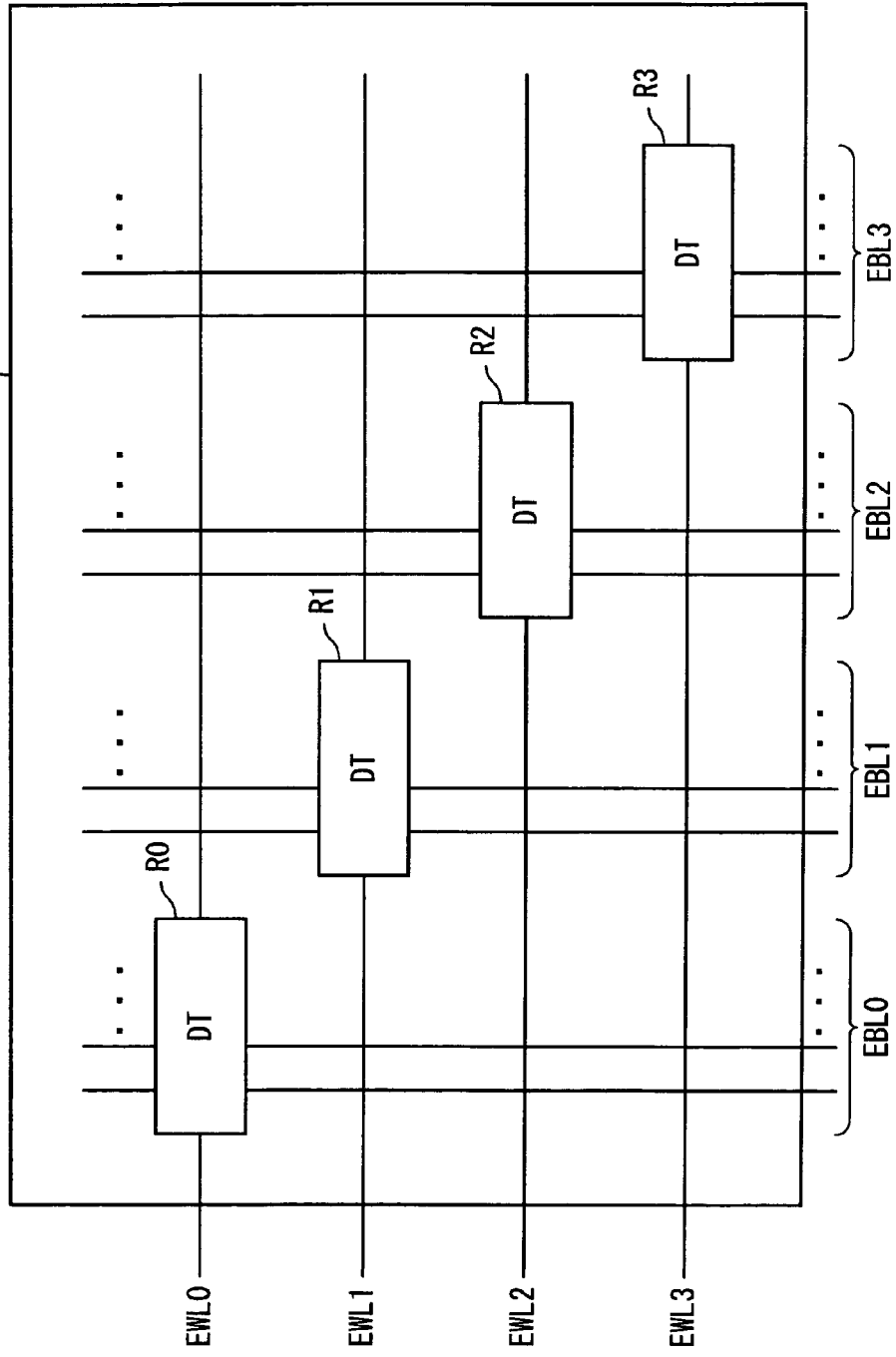
FIG. 3 is a schematic diagram showing another example of a placement of EXTRA regions in the present embodiment.

FIG. 3 shows another example of a placement of the EXTRA regions R0 to R3. As in the case of FIG. 2, the EXTRA regions R0 to R3 are connected to different word lines EWL0 to EWL3, respectively. Therefore, the influence of the read disturb is suppressed, which is preferable. Moreover, in the example shown in FIG. 3, the EXTRA regions R0 to R3 are connected to different bit line groups EBL0 to EBL3, respectively. An effect obtained by this is as follows.

At the test after the manufacture of chips, the determined trimming data DT needs to be written to the EXTRA regions R0 to R3 in order. At a time of data writing to a selected memory cell, a high voltage is applied to a selected bit line connected to the selected memory cell. The high voltage can affect data characteristics of memory cells other than the selected memory cell connected to the selected bit line (i.e. write disturb). In the case of the example shown in FIG. 2, the EXTRA regions R0 to R3 are connected to the same bit line group EBL. Therefore, each EXTRA region is affected by the write disturb for a number of times, when the trimming data DT is written to the EXTRA regions R0 to R3 in order. In the case of the example shown in FIG. 3, on the other hand, the EXTRA regions R0 to R3 are connected to the different bit line groups EBL0 to EBL3, respectively. Thus, the write disturb can be prevented or reduced.

2. Circuit Configuration Example and Operation

Figure 4:
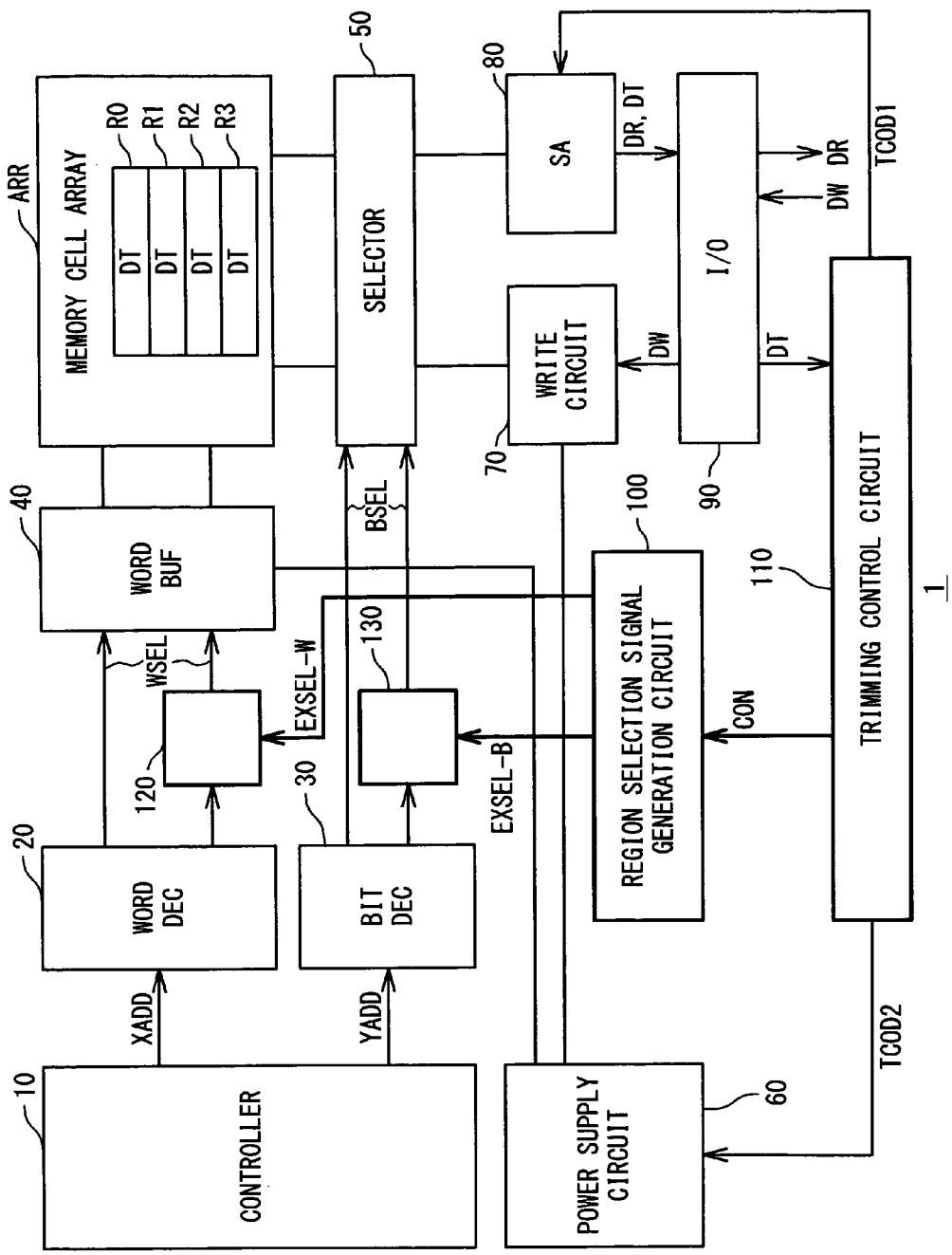
FIG. 4 is a block diagram showing a circuit configuration example of the data processing device according to the present embodiment.

FIG. 4 is a block diagram showing a circuit configuration example of the data processing device 1 according to the present embodiment. As shown in FIG. 4, the data processing device 1 is provided with the memory cell array ARR, a controller 10, a word decoder 20, a bit decoder 30, a word buffer 40, a selector 50, a power supply circuit 60, a write circuit 70, a sense amplifier 80 and an IO circuit 90.

At a time of access to the memory cell array ARR, the controller 10 outputs address signals XADD and YADD to the word decoder 20 and the bit decoder 30, respectively. The address signals XADD and YADD specify an address of a selected memory cell as an access target. More specifically, the address signal XADD specifies a word address of the selected memory cell, while the address signal YADD specifies a bit address of the selected memory cell.

The word decoder 20 outputs to the word buffer 40 a word selection signal WSEL corresponding to the address signal XADD. The word selection signal WSEL specifies a selected word line connected to the selected memory cell. In response to the word selection signal WSEL, the word buffer 40 drives the selected word line. A drive voltage (word voltage) applied to the selected word line is supplied from the power supply circuit 60.

The bit decoder 30 outputs to the selector 50 a bit selection signal BSEL corresponding to the address signal YADD. The bit selection signal BSEL specifies a selected bit line connected to the selected memory cell. In response to the bit selection signal BSEL, the selector 50 electrically connects the selected bit line with the write circuit 70 or the sense amplifier 80.

At a time of data writing, the write circuit 70 receives a write data DW through the IO circuit 90. Then, the write circuit 70 applies a write voltage corresponding to the write data DW to the selected bit line. The write voltage is supplied from the power supply circuit 60.

At a time of data reading, a predetermined read voltage is applied to the selected bit line, and a cell current (read current) depending on the stored data flows through the selected memory cell. The sense amplifier 80 compares the cell current flowing through the selected bit line with a reference current to determine the stored data in the selected memory cell. The result is output as a read data DR through the IO circuit 90.

(Reading of Trimming Data DT)

Next, the reading of the trimming data DT from an EXTRA region at the power-on will be described below. As shown in FIG. 4, the data processing device 1 according to the present embodiment is further provided with a region selection signal generation circuit 100, a trimming control circuit 110, an EXTRA word decoder 120 and an EXTRA bit decoder 130.

At the time of the power-on, the region selection signal generation circuit 100 receives a control signal CON from the trimming control circuit 110. In response to the control signal CON, the region selection signal generation circuit 100 randomly selects one of the plurality of EXTRA regions R0 to R3 as the target EXTRA region. Then, the region selection signal generation circuit 100 generates a "region selection signal EXSEL" that specifies the randomly selected target EXTRA region. The region selection signal EXSEL includes region selection signals EXSEL-W and EXSEL-B that respectively specify the selected word line and the selected bit line connected to the target EXTRA region. The region selection signal generation circuit 100 outputs the region selection signals EXSEL-W and EXSEL-B to the EXTRA word decoder 120 and the EXTRA bit decoder 130, respectively.

As shown in FIG. 4, the EXTRA word decoder 120 is provided between the word decoder 20 and the word buffer 40. At the time of the reading of the trimming data DT, the EXTRA word decoder 120 outputs the region selection signal EXSEL-W as the word selection signal WSEL to the word buffer 40.

Figure 5:
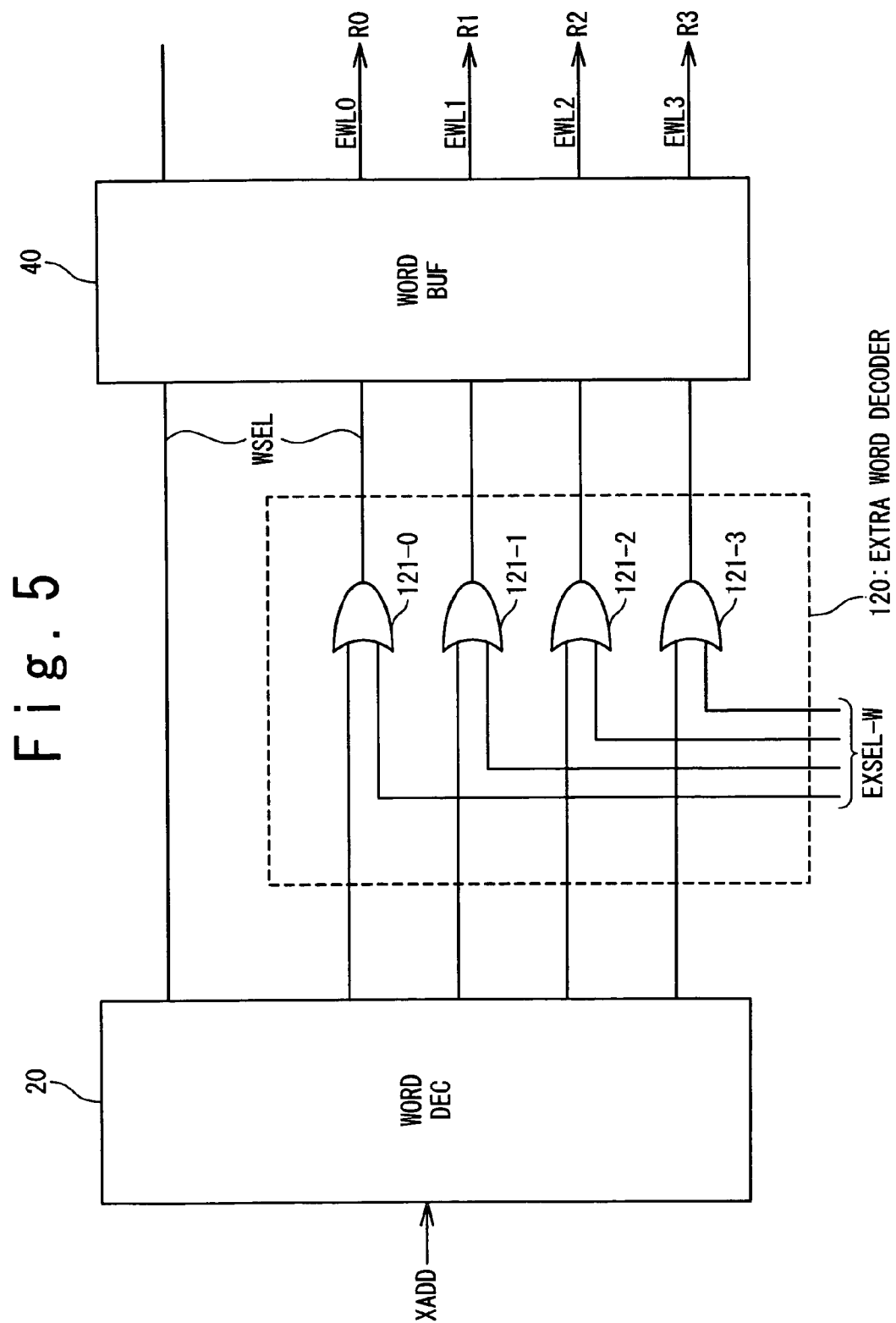
FIG. 5 is a circuit diagram showing a configuration example of an EXTRA word decoder in the present embodiment.

FIG. 5 shows a configuration example of the EXTRA word decoder 120. As an example, let us consider a case where the four EXTRA regions R0 to R3 are respectively connected to the four different word lines EWL0 to EWL3 (refer to FIGS. 2 and 3). In this case, a 4-bit region selection signal EXSEL-W is input to the EXTRA word decoder 120. For example, only one bit associated with the target EXTRA region among the four bits is High level, and the other bits are Low level.

As shown in FIG. 5, the EXTRA word decoder 120 includes OR gates 121-0 to 121-3. The four bits of the region selection signal EXSEL-W are input to the OR gates 121-0 to 121-3, respectively. Also, outputs of the word decoder 20 which are respectively associated with the word lines EWL0 to EWL3 are input to the OR gates 121-0 to 121-3. At the time of the reading of the trimming data DT, all outputs of the word decoder 20 are Low level. Therefore, the region selection signal EXSEL-W is output as the word selection signal WSEL to the word buffer 40. The word buffer 40 drives one of the word lines EWL0 to EWL3 in response to the High level bit of the region selection signal EXSEL-W. In this manner, one word line connected to the target EXTRA region is selectively driven with a simple circuit configuration.

It should be noted that when the trimming data DT is written to the EXTRA regions R0 to R3, outputs from the word decoder 20 are supplied to the word buffer 40 through the EXTRA word decoder 120.

Referring back to FIG. 4 again, the EXTRA bit decoder 130 is provided between the bit decoder 30 and the selector 50. At the time of the reading of the trimming data DT, the EXTRA bit decoder 130 outputs the region selection signal EXSEL-B as the bit selection signal BSEL to the selector 50.

Figure 6:
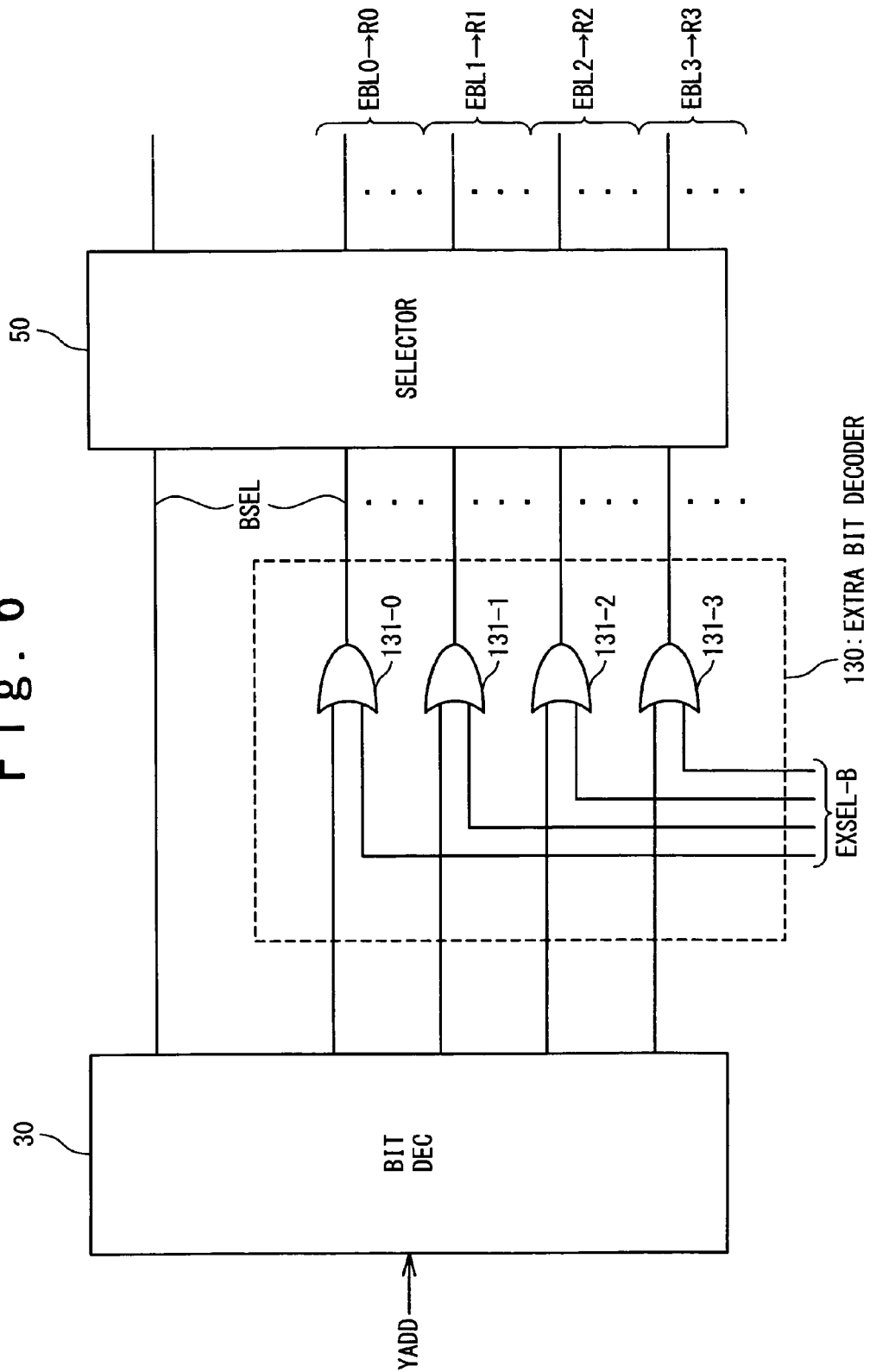
FIG. 6 is a circuit diagram showing a configuration example of an EXTRA bit decoder in the present embodiment.

FIG. 6 shows a configuration example of the EXTRA bit decoder 130. As an example, let us consider a case where the four EXTRA regions R0 to R3 are respectively connected to the different bit line groups EBL0 to EBL3 (refer to FIG. 3). In this case, a region selection signal EXSEL-B that specifies a selected bit line group connected to the target EXTRA region among the bit line groups EBL0 to EBL3 is input to the EXTRA bit decoder 130. For example, only bits associated with the selected bit line group among bits of the region selection signal EXSEL-B are High level, and the other bits are Low level.

As shown in FIG. 6, the EXTRA bit decoder 130 includes OR gate groups 131-0 to 131-3 which are respectively associated with the bit line groups EBL0 to EBL3. The respective bits of the region selection signal EXSEL-B are input to the OR gates. Also, outputs of the bit decoder 30 which are respectively associated with the bit line groups EBL0 to EBL3 are input to the OR gate groups 131-0 to 131-3. At the time of the reading of the trimming data DT, all outputs of the bit decoder 30 are Low level. Therefore, the region selection signal EXSEL-B is output as the bit selection signal BSEL to the selector 50. The selector 50 electrically connects the selected bit line group with the sense amplifier 80 in response to the High level bits of the region selection signal EXSEL-B. In this manner, one bit line group connected to the target EXTRA region is selected with a simple circuit configuration.

It should be noted that when the trimming data DT is written to the EXTRA regions R0 to R3, outputs from the bit decoder 30 are supplied to the selector 50 through the EXTRA bit decoder 130.

In this manner, at the time of the reading of the trimming data DT, the selected word line connected to the target EXTRA region is driven and the selected bit line group connected to the target EXTRA region is selected. As in the normal operation, the sense amplifier 80 compares the cell current flowing through each selected bit line with the reference current to determine the trimming data DT stored in the target EXTRA region. As shown in FIG. 4, the obtained trimming data DT is output to the trimming control circuit 110. The trimming control circuit 110 stores the received trimming data DT in a storage region such as a register. Moreover, the trimming control circuit 110 controls the trimming based on the trimming data DT. Examples of the trimming will be described in detail later in the Section 4.

According to the present embodiment, as described above, the region selection signal generation circuit 100 generates and outputs the region selection signal EXSEL that randomly specifies the target EXTRA region. In response to the region selection signal EXSEL, the trimming data DT is read out from the target EXTRA region. The above-mentioned EXTRA word decoder 120, EXTRA bit decoder 130, word buffer 40, selector 50, sense amplifier 80 and IO circuit 90 function as a "trimming data read circuit" that reads the trimming data DT from the target EXTRA region. The trimming data read circuit, region selection signal generation circuit 100 and trimming control circuit 110 correspond to the "trimming data read control circuit 3" shown in FIG. 1.

3. Region Selection Signal Generation Circuit 100

As described above, the region selection signal generation circuit 100 randomly selects one of the plurality of EXTRA regions R0 to R3 as the target EXTRA region in response to the control signal CON. Then, the region selection signal generation circuit 100 generates the region selection signal EXSEL that specifies the randomly selected target EXTRA region. Various methods can be considered as follows.

3-1. First Example

Figure 7:
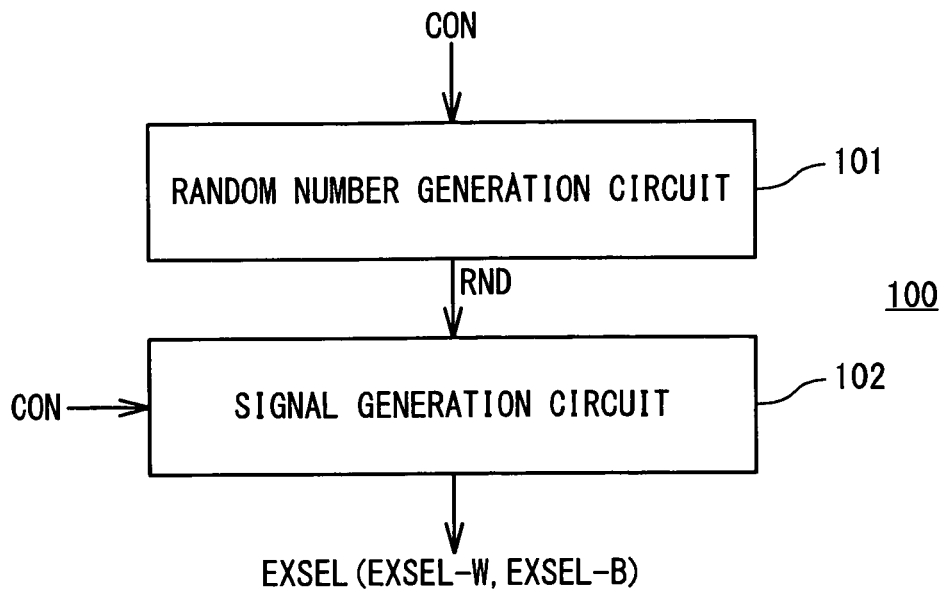
FIG. 7 is a block diagram showing a first example of a region selection signal generation circuit in the present embodiment.

FIG. 7 shows a first example of the region selection signal generation circuit 100. In the first example, the region selection signal generation circuit 100 has a random number generation circuit 101 and a signal generation circuit 102. The random number generation circuit 101 is a widely-known one and generates a random number RND. More specifically, the random number generation circuit 101 starts operating simultaneously with the power-on and stops operating in response to the input of the control signal CON (e.g. reset signal). The signal generation circuit 102 generates the region selection signal EXSEL based on the random number RND that is being output by the random number generation circuit 101 at the time of the input of the control signal CON.

For example, the random number generation circuit 101 generates numbers "0, 1, 2 and 3" in a random manner. The numbers 0 to 3 are related to the EXTRA regions R0 to R3, respectively. For example, in a case where the random number generation circuit 101 is outputting the number "2" at the time of the input of the control signal CON, the signal generation circuit 102 selects the EXTRA region R2 as the target EXTRA region. Then, the signal generation circuit 102 generates the region selection signal EXSEL (EXSEL-W, EXSEL-B) that specifies the EXTRA region R2. The same applies to the other cases. Consequently, the target EXTRA region to be selected becomes random.

3-2. Second Example

Figure 8:
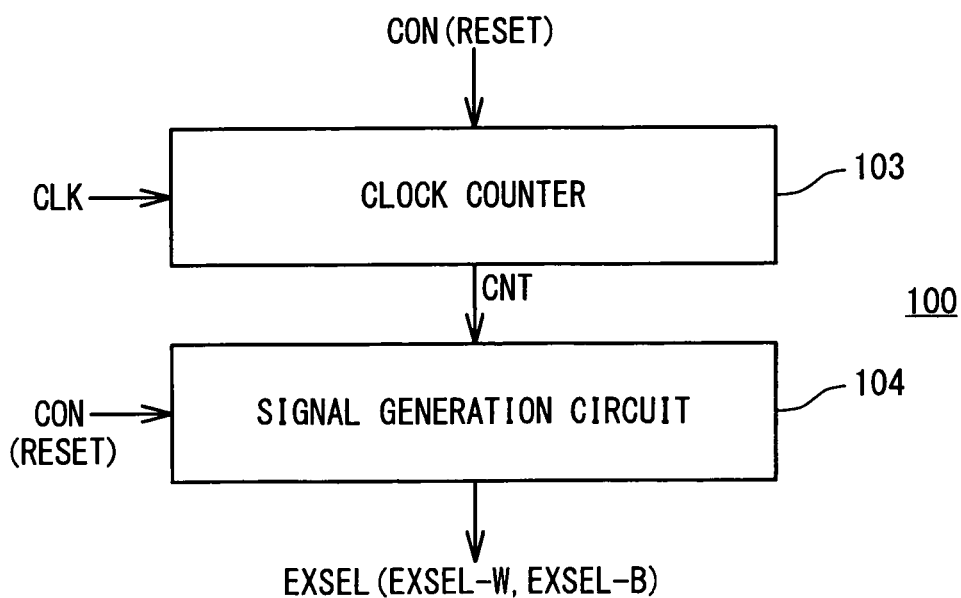
FIG. 8 is a block diagram showing a second example of a region selection signal generation circuit in the present embodiment.

FIG. 8 shows a second example of the region selection signal generation circuit 100. In the second example, the region selection signal generation circuit 100 has a clock counter 103 and a signal generation circuit 104. The clock counter 103 counts a clock signal CLK. More specifically, the clock counter 103 starts operating simultaneously with the power-on and stops operating in response to the input of the control signal CON. In other words, the clock counter 103 continues to count the clock signal CLK until the control signal CON is input. The signal generation circuit 104 generates the region selection signal EXSEL based on a count value CNT that is being output by the clock counter 103 at the time of the input of the control signal CON.

For example, when the count value CNT is 4m (m is an integer equal to or more than 0), the signal generation circuit 104 selects the EXTRA region R0 as the target EXTRA region. Similarly, when the count value CNT is 4m+1, the EXTRA region R1 is selected as the target EXTRA region. When the count value CNT is 4m+2, the EXTRA region R2 is selected as the target EXTRA region. When the count value CNT is 4m+3, the EXTRA region R3 is selected as the target EXTRA region.

In the present example, a reset signal RESET is used as the control signal CON. The reset signal RESET is input to the region selection signal generation circuit 100 (clock counter 103) at a random timing. As a result, the count value CNT at the time of the input of the reset signal RESET becomes random. Consequently, the target EXTRA region to be selected becomes random.

Figure 9:
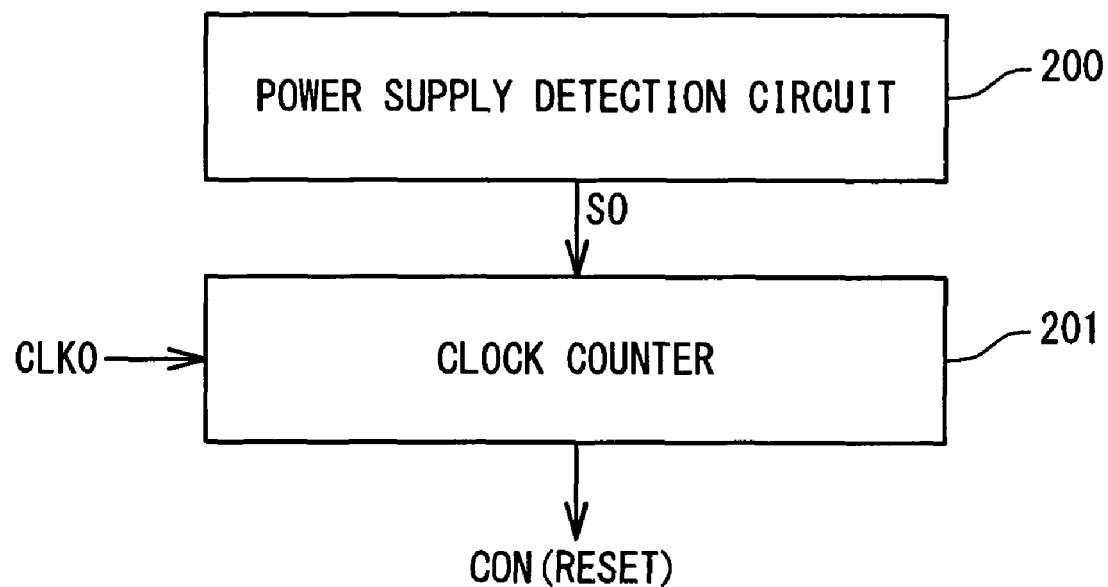
FIG. 9 is a block diagram showing a circuit configuration for generating a reset signal in the present embodiment.
Figure 10:
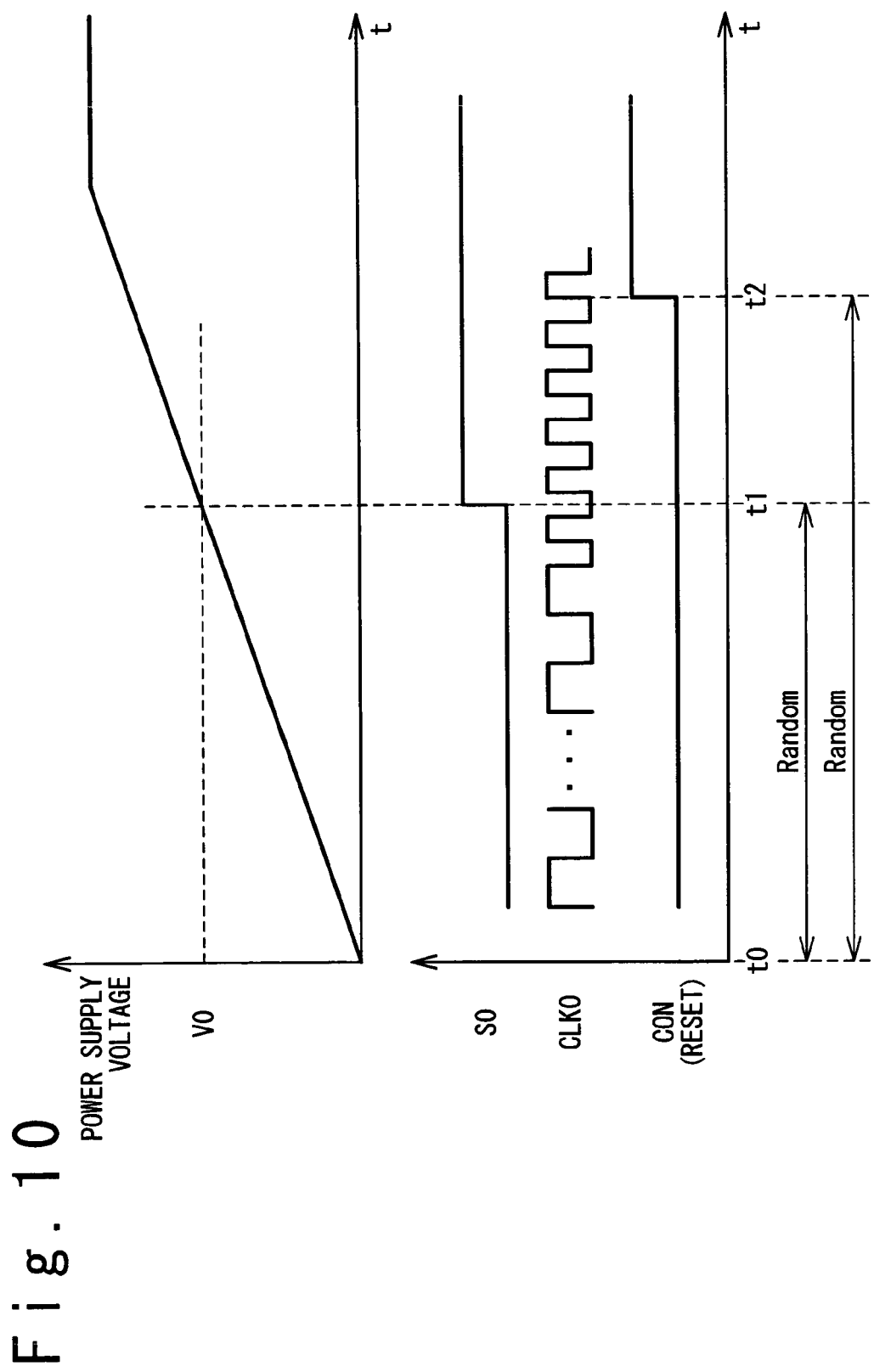
FIG. 10 is a timing chart for explaining a method of generating the reset signal in the present embodiment.

The fact that the reset signal RESET is generated at a random timing will be explained with reference to FIGS. 9 and 10. FIG. 9 shows a circuit configuration for generating the reset signal RESET. The circuit shown in FIG. 9 is provided, for example, in the trimming control circuit 110. FIG. 10 is a timing chart for explaining a method of generating the reset signal RESET.

When the power is turned ON at a time t0, the power supply voltage starts increasing. A slope (gradient) of the increase in the power supply voltage depends on temperature and the like and thus is different every time. A power supply detection circuit 200 monitors the power supply voltage. At a time t1 when the power supply voltage exceeds a certain threshold level V0, the power supply detection circuit 200 outputs a signal S0 to a clock counter 201. The signal S0 is a signal notifying that the power supply voltage is increased to a level that circuits are able to operate. When receiving the signal S0, the clock counter 201 starts to count a clock signal CLK0. After that, when its count value becomes equal to a predetermined value, the clock counter 201 outputs the reset signal RESET. For example, the clock counter 201 outputs the reset signal RESET at the fifth rising edge of the clock signal CLK0 (at a time t2 in FIG. 10). Since the slope of the increase in the power supply voltage is different every time, the output timing of the signal S0 (an interval from time t0 to t1) is random. Consequently, the output timing of the reset signal RESET (an interval from time t0 to t2) also becomes random. The reset signal RESET thus generated is input to the region selection signal generation circuit 100.

3-3. Third Example

Figure 11:
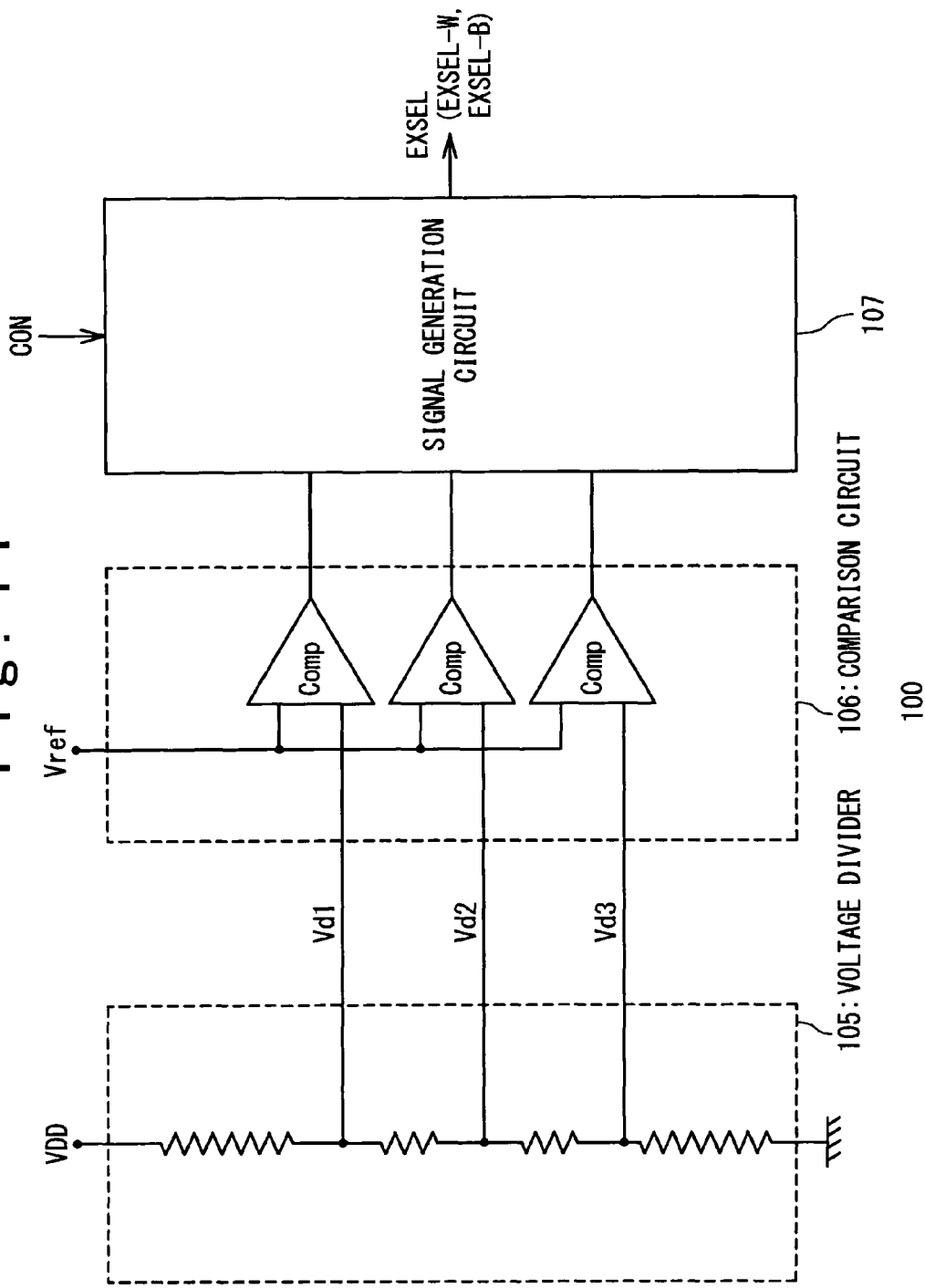
FIG. 11 is a block diagram showing a third example of a region selection signal generation circuit in the present embodiment.

FIG. 11 shows a third example of the region selection signal generation circuit 100. In the third example, the region selection signal generation circuit 100 has a voltage divider 105, a comparison circuit 106 and a signal generation circuit 107. The voltage divider 105 divides the power supply voltage VDD to generate a plurality of voltages Vd1, Vd2 and Vd3 which are different from each other. The comparison circuit 106 compares the respective voltages Vd1 to Vd3 with a reference voltage Vref. In response to the control signal CON (e.g. the reset signal RESET), the signal generation circuit 107 generates the region selection signal EXSEL based on a result of the comparison by the comparison circuit 106.

Figure 12:
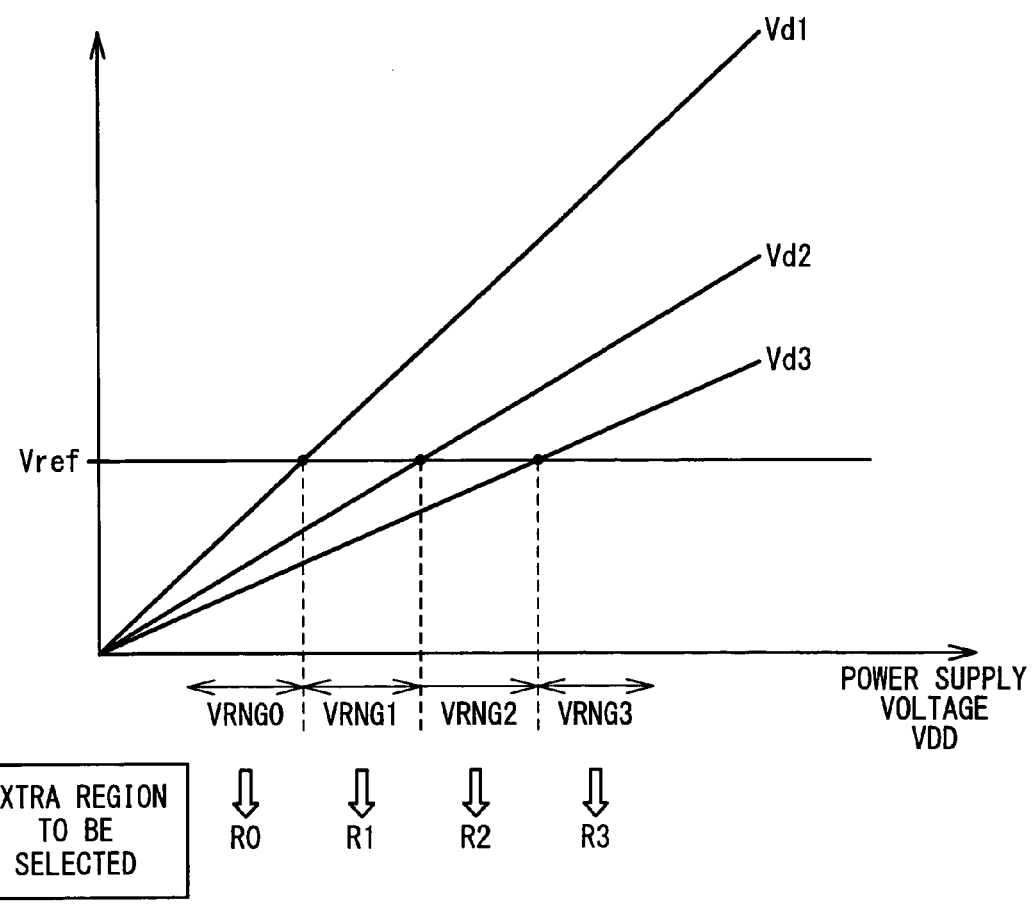
FIG. 12 is a diagram for explaining an operation of the region selection signal generation circuit shown in FIG. 11.

FIG. 12 is a graph showing dependence of a relationship between the voltages Vd1 to Vd3 and the reference voltage Vref on the power supply voltage VDD. The abscissa axis is the power supply voltage VDD. The respective voltages Vd1 to Vd3 vary depending on the power supply voltage VDD. The relationship between the voltages Vd1 to Vd3 and the reference voltage Vref, namely, the comparison result can be classified into four patterns depending on a voltage range of the power supply voltage VDD. For example, in a case where the power supply voltage VDD is within a voltage range VRNG0, the voltages Vd1 to Vd3 all are lower than the reference voltage Vref. In the case of this pattern, the signal generation circuit 107 selects the EXTRA region R0 as the target EXTRA region and generates the region selection signal EXSEL (EXSEL-W, EXSEL-B) that specifies the EXTRA region R0. Similarly, voltage ranges VRNG1, VRNG2 and VRNG3 shown in FIG. 12 are related to the EXTRA regions R1, R2 and R3, respectively.

As explained in the foregoing FIG. 10, the slope of the increase in the power supply voltage VDD depends on temperature and the like and thus is different every time. Therefore, the power supply voltage VDD at the time when the control signal CON (e.g. the reset signal RESET) is input also is different every time. Consequently, the target EXTRA region to be selected becomes random.

3-4. Fourth Example

Figure 13:
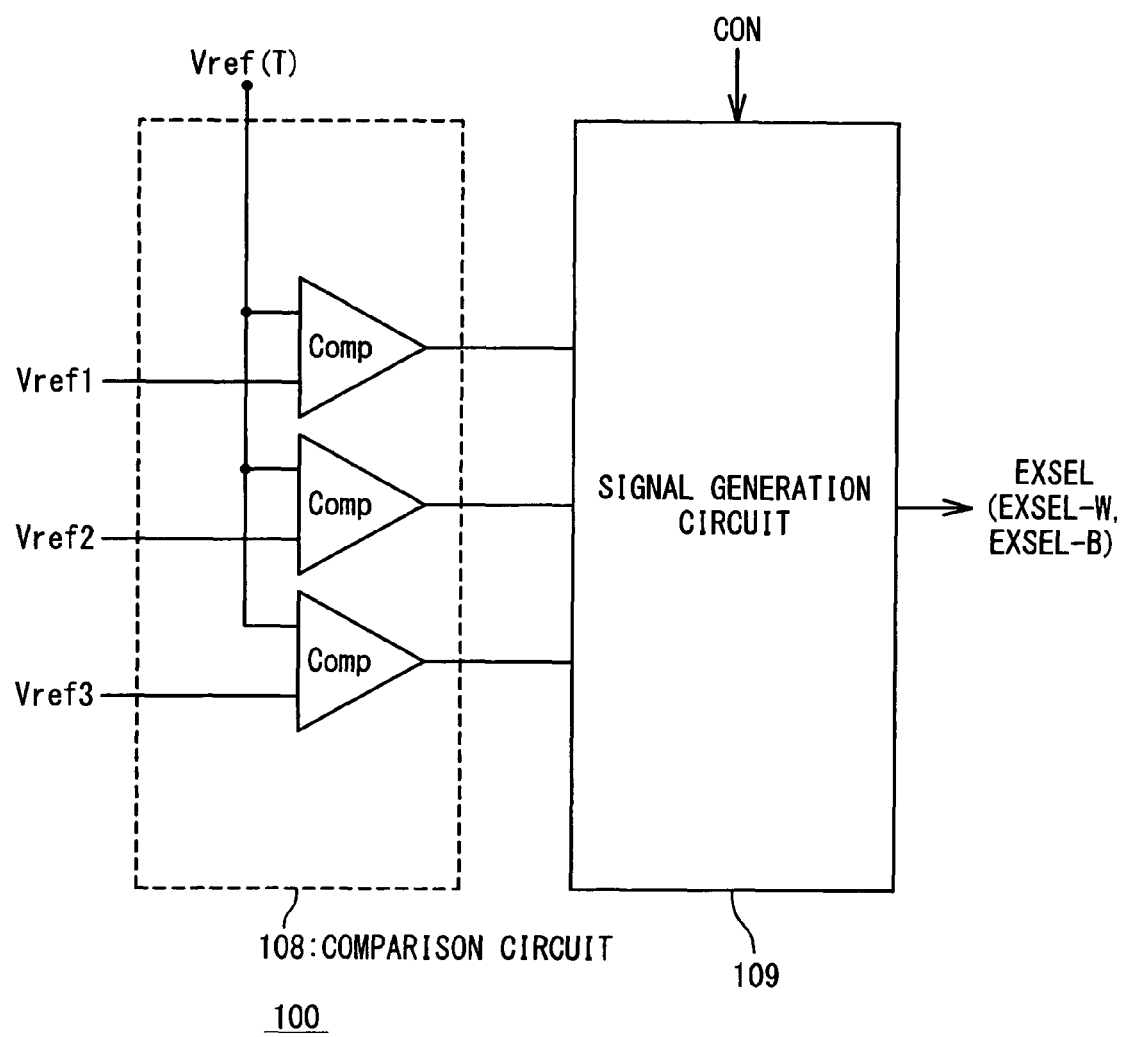
FIG. 13 is a block diagram showing a fourth example of a region selection signal generation circuit in the present embodiment.

FIG. 13 shows a fourth example of the region selection signal generation circuit 100. In the fourth example, the region selection signal generation circuit 100 has a comparison circuit 108 and a signal generation circuit 109. The comparison circuit 108 compares a reference voltage Vref(T) with a plurality of reference voltages Vref1, Vref2 and Vref3 which are different from each other. The reference voltage Vref(T) has temperature dependence and varies depending on the temperature T. On the other hand, the reference voltages Vref1, Vref2 and Vref3 do not have such temperature dependence. In response to the control signal CON (e.g. the reset signal RESET), the signal generation circuit 109 generates the region selection signal EXSEL based on a result of the comparison by the comparison circuit 108.

Figure 14:
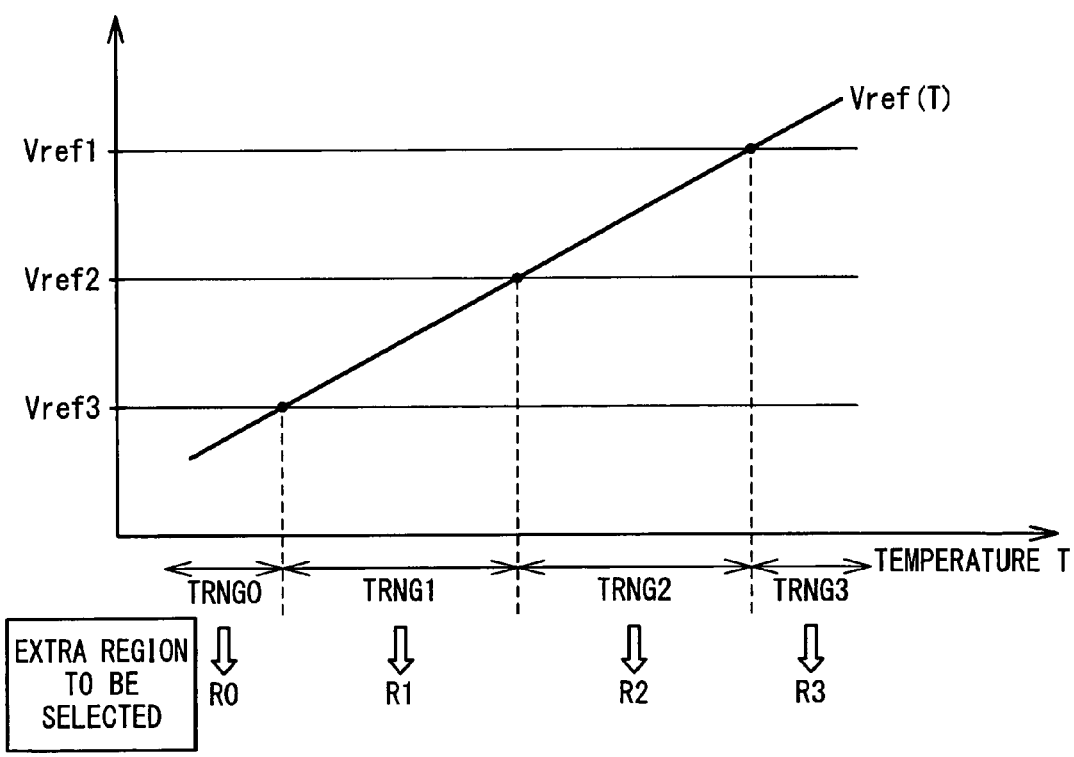
FIG. 14 is a diagram for explaining an operation of the region selection signal generation circuit shown in FIG. 13.

FIG. 14 is a graph showing dependence of a relationship between the reference voltages Vref1 to Vref3 and the reference voltage Vref(T) on the temperature T. The abscissa axis is the temperature T. The reference voltage Vref(T) varies depending on the temperature T. The relationship between the reference voltages Vref1 to Vref3 and the reference voltage Vref(T), namely, the comparison result can be classified into four patterns depending on a range of the temperature T. For example, in a case where the temperature T is within a temperature range TRNG0, the reference voltages Vref1 to Vref3 all are higher than the reference voltage Vref(T). In the case of this pattern, the signal generation circuit 109 selects the EXTRA region R0 as the target EXTRA region and generates the region selection signal EXSEL (EXSEL-W, EXSEL-B) that specifies the EXTRA region R0. Similarly, temperature ranges TRNG1, TRNG2 and TRNG3 shown in FIG. 14 are related to the EXTRA regions R1, R2 and R3, respectively.

Since the temperature T can differ at every power-on, the target EXTRA region to be selected becomes random.

4. Trimming

Figure 15:
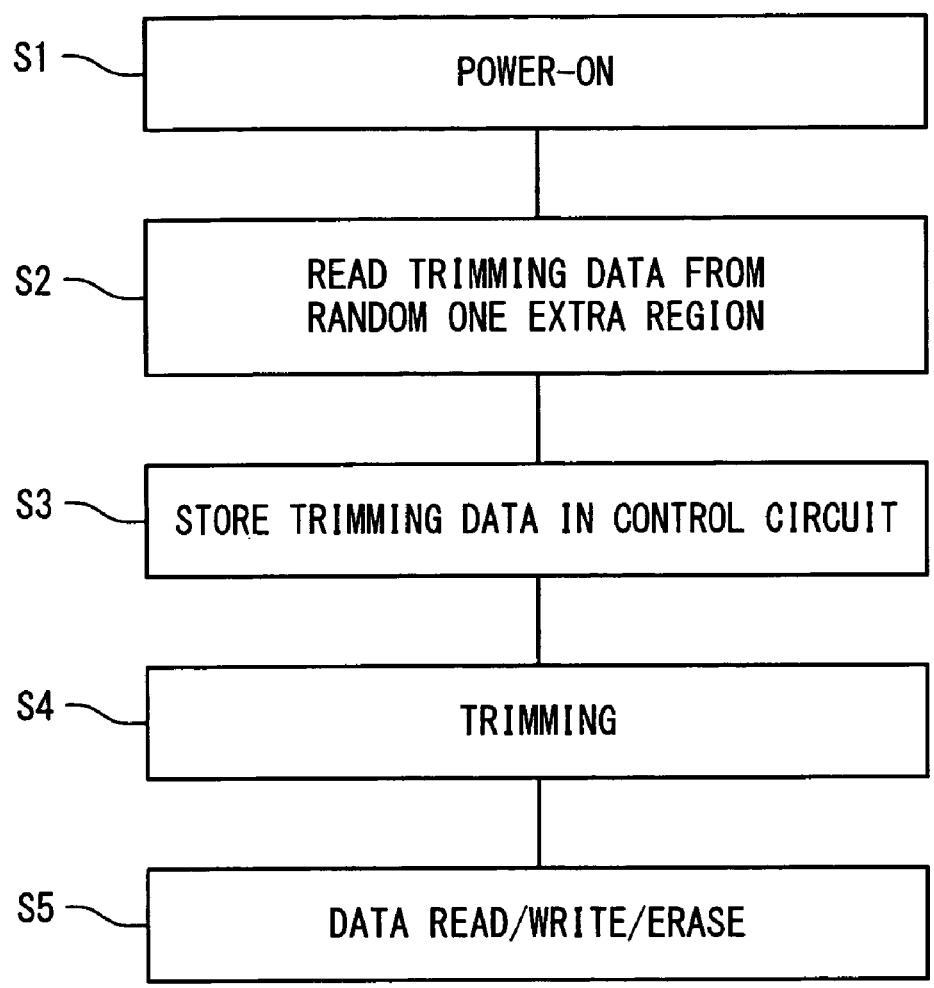
FIG. 15 is a flow chart showing an operation of the data processing device according to the present embodiment.

FIG. 15 is a flow chart showing an operation summary of the data processing device 1 according to the present embodiment. First, the data processing device 1 is powered ON (Step S1). In response to the power-on, the control signal CON (reset signal RESET) is generated. In response to the control signal CON, the region selection signal generation circuit 100 randomly selects a target EXTRA region and generates the region selection signal EXSEL specifying the selected target EXTRA region. The above-mentioned trimming data read circuit reads the trimming data DT from the target EXTRA region specified by the region selection signal EXSEL (Step S2). The trimming control circuit 110 stores the read trimming data DT in a storage region such as a register (Step S3).

At Step S4, the trimming of circuit characteristics is performed based on the read trimming data DT. For example, as shown in FIG. 4, the trimming control circuit 110 generates a trimming code TCOD1 from the trimming data DT and outputs the trimming code TCOD1 to the sense amplifier 80. In the sense amplifier 80, the reference current is adjusted to an optimum value in accordance with the trimming code TCOD1. Also, the trimming control circuit 110 generates a trimming code TCOD2 from the trimming data DT and outputs the trimming code TCOD2 to the power supply circuit 60. In the power supply circuit 60, the output voltage is adjusted to an optimum value in accordance with the trimming code TCOD2. After the circuit characteristics are adjusted to the respective optimum values, normal operations (i.e. read, write, erase) are performed (Step S5).

The trimming of the reference current in the sense amplifier 80 and the trimming of the output voltage in the power supply circuit 60 will be described below.

(Sense Amplifier 80)

Figure 16:
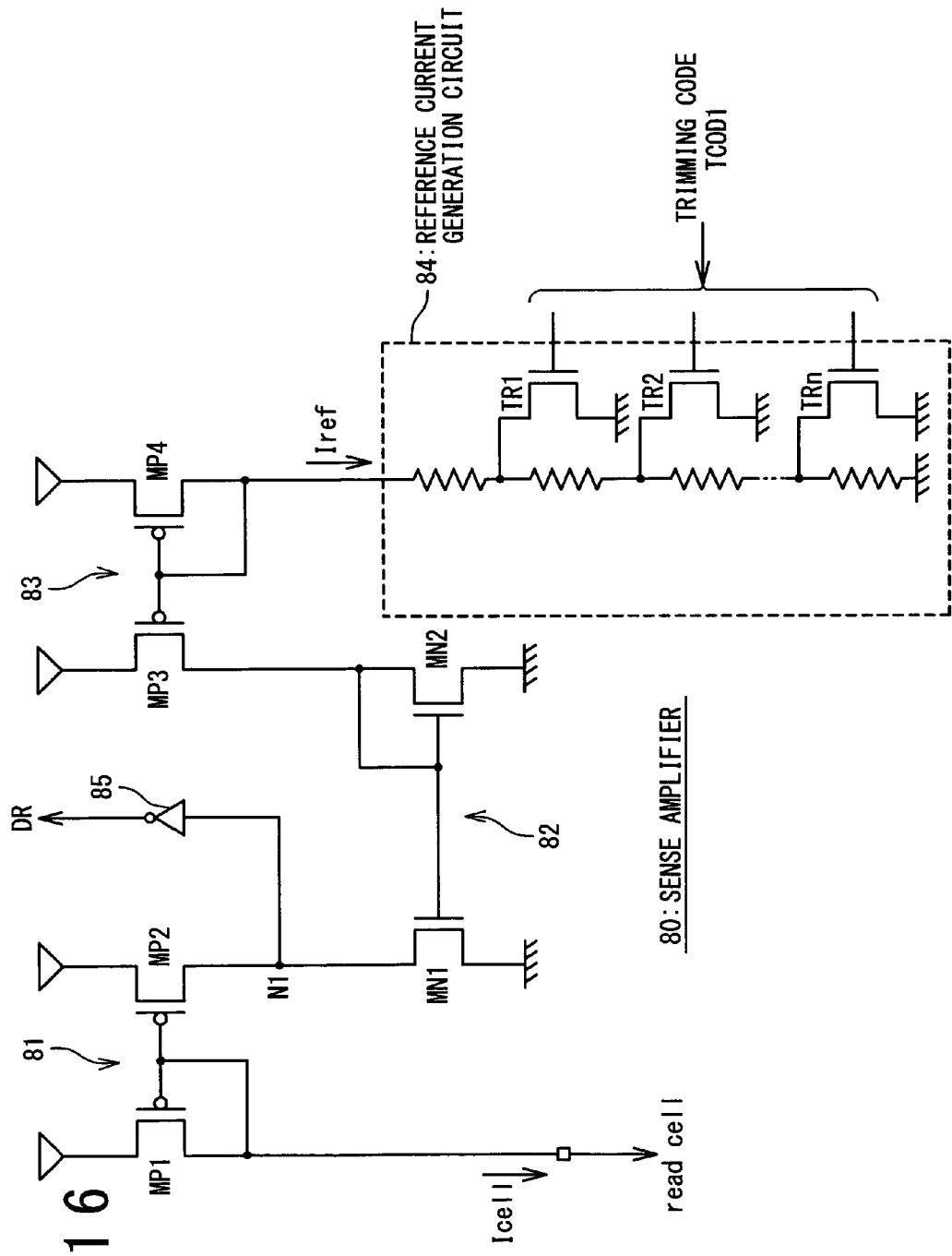
FIG. 16 is a circuit diagram showing a configuration of a sense amplifier in the present embodiment.

FIG. 16 is a circuit diagram showing a configuration of the sense amplifier 80 in the present embodiment. The sense amplifier 80 has current mirror circuits 81 to 83, a reference current generation circuit 84 and an inverter 85. The current mirror circuit 81 consists of PMOS transistors MP1 and MP2 and is connected to the selected bit line and a node N1. The current mirror circuit 82 consists of NMOS transistors MN1 and MN2 and is connected to the node N1 and the current mirror circuit 83. The current mirror circuit 83 consists of PMOS transistors MP3 and MP4 and is connected to the current mirror circuit 82 and the reference current generation circuit 84. The inverter 85 is connected to the node N1.

The reference current generation circuit 84 is a current source for generating the reference current Iref. Due to the current mirror circuits 82 and 83, a current whose magnitude is equal to the reference current Iref flows out of the node N1. On the other hand, due to the current mirror circuit 81, a current whose magnitude is equal to the cell current Icell flowing through the selected bit line flows into the node N1. A voltage at the node N1 varies depending on the magnitude relation between the reference current Iref and the cell current Icell. Then, an inverted logic value of the logic value at the node N1 is output as the read data DR.

The reference current Iref output from the reference current generation circuit 84 can be adjusted by using the trimming code TCOD1. More specifically, the reference current generation circuit 84 is provided with n pieces of transistors TR1 to TRn and a resistor section including serially-connected resistors. A resistance value of the resistor section can be set variably depending on ON/OFF states of the transistors TR1 to TRn. For that purpose, a n-bit trimming code TCOD1 is input to the reference current generation circuit 84. The n bits are respectively input to gates of the transistors TR1 to TRn. As a result, the resistance value namely the reference current Iref is set to a value corresponding to the trimming code TCOD1. The trimming code TCOD1 is determined such that the reference current Iref is set to the optimum value.

(Power Supply Circuit 60)

Figure 17:
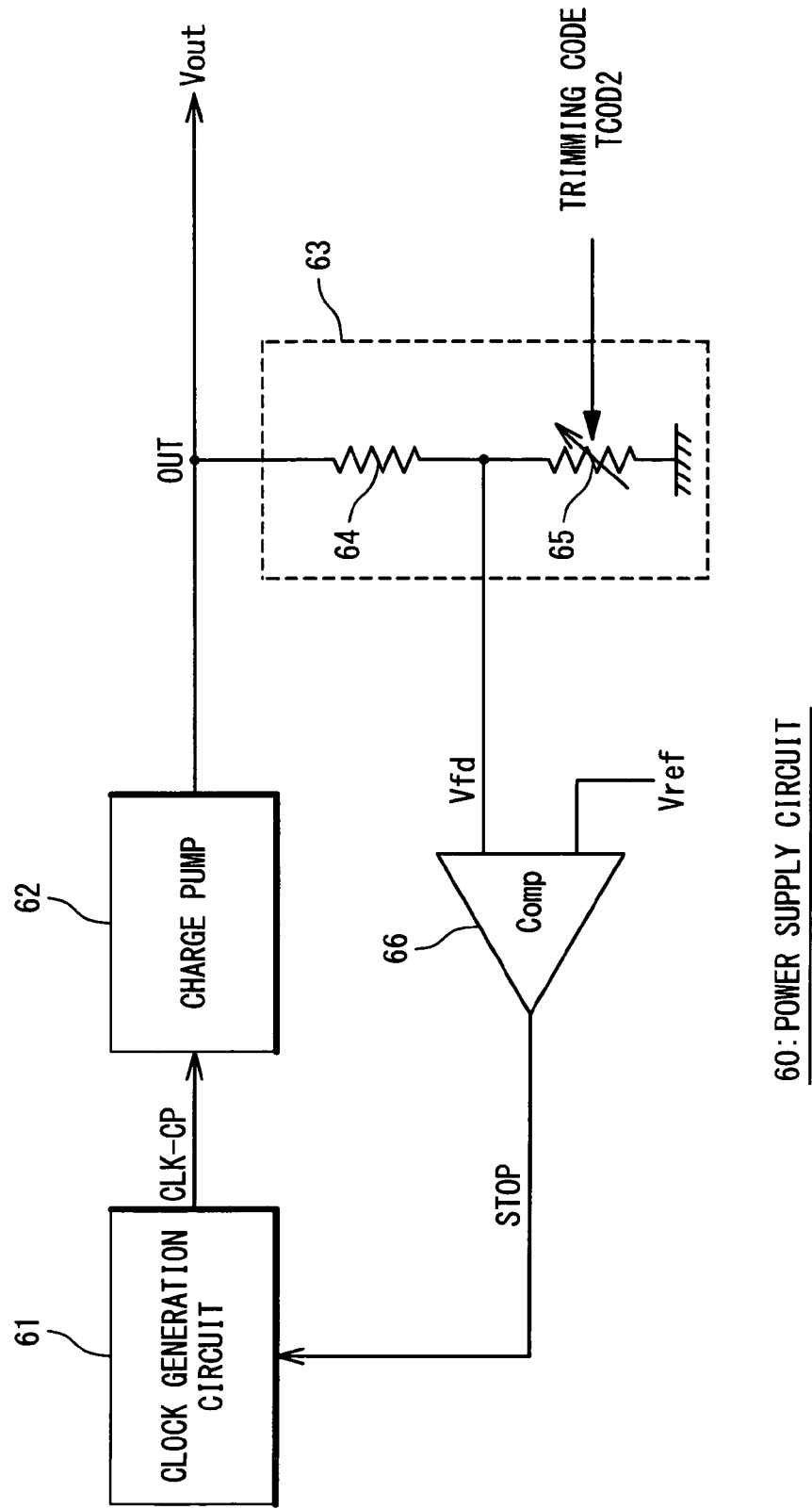
FIG. 17 is a block diagram showing a configuration of a power supply circuit in the present embodiment.

FIG. 17 is a block diagram showing a configuration of the power supply circuit 60 in the present embodiment. The power supply circuit 60 has a clock generation circuit 61, a charge pump 62, a feedback resistor 63, a comparison circuit 66 and an output terminal OUT. The clock generation circuit 61 generates a clock signal CLK-CP and outputs the clock signal CLK-CP to the charge pump 62. The charge pump 62 performs boosting based on the clock signal CLK-CP and outputs an output voltage Vout to the output terminal OUT. The output voltage Vout is used, for example, as the high voltage at the time of the data writing.

The feedback resistor 63 includes a resistor 64 and a variable resistor 65 that are serially connected between the output terminal OUT and the ground. A resistance value of the variable resistor 65 can be set variably by the trimming code TCOD2. That is to say, a resistance ratio between the resistor 64 and the variable resistor 65 varies depending on the trimming code TCOD2. A feedback voltage Vfd is generated by the feedback resistor 63. The feedback voltage Vfd is determined depending on the output voltage Vout at the output terminal OUT and the above-mentioned resistance ratio.

The comparison circuit 66 makes a comparison between the feedback voltage Vfd and a predetermined reference voltage Vref, and outputs a stop signal STOP depending on the comparison result to the clock generation circuit 61. The stop signal STOP is a signal that indicates execution or suspension of the clock generation. For example, when the feedback voltage Vfd becomes higher than the reference voltage Vref, the stop signal STOP is activated and thereby the clock generation circuit 61 stops generating the clock signal CLK-CP. As a result, the charge pump 62 also stops the boosting operation and thus the output voltage Vout decreases. When the output voltage Vout is decreased, the feedback voltage Vfd also is decreased. When the feedback voltage Vfd becomes lower than the reference voltage Vref, the stop signal STOP is deactivated and thereby the clock generation circuit 61 resumes generating the clock signal CLK-CP. As a result, the charge pump 62 also resumes the boosting operation and thus the output voltage Vout increases.

Due to the above-described feedback, the output voltage Vout is maintained at a level where the feedback voltage Vfd is substantially equal to the reference voltage Vref. To put it the other way around, the feedback voltage Vfd becomes substantially equal to the reference voltage Vref, and the output voltage Vout is set to a level determined by the reference voltage Vref and the above-mentioned resistance ratio. Therefore, the output voltage Vout can be adjusted by changing the resistance ratio. In other words, it is possible by using the trimming code TCOD2 to adjust the output voltage Vout to an optimum value. The trimming code TCOD2 is determined such that the output voltage Vout is set to the optimum value.

It is apparent that the present invention is not limited to the above embodiments and may be modified and changed without departing from the scope and spirit of the invention.

What is claimed is:
1. A data processing device comprising:
a nonvolatile memory comprising a plurality of memory regions in which a same trimming data is stored;
a trimming data read control circuit configured to read said trimming data from a random one of said plurality of memory regions; and
a random number generator being configured to output a random number, the random number determining which one of the plurality of memory regions is the random one of the plurality of memory regions read by the trimming data read control circuit.

2. The data processing device according to claim 1, wherein said trimming data read control circuit comprises:
  a region selection signal generation circuit configured to generate a region selection signal that specifies a random one memory region among said plurality of memory regions; and
  a read circuit configured to read said trimming data from said random one memory region in response to said region selection signal.

3. The data processing device according to claim 2, wherein said region selection signal generation circuit comprises a random number generation circuit configured to generate a random number.

4. The data processing device according to claim 1, wherein said plurality of memory regions are connected to different word lines, respectively.

5. The data processing device according to claim 4, wherein said plurality of memory regions are connected to different bit lines, respectively.

6. The data processing device according to claim 1, wherein the trimming data read control circuit comprises a region selection signal generation circuit configured to generate a region selection signal that specifies the random one of the plurality of memory regions among the plurality of memory regions, and to output the region selection signals to a word line connected to the random one of the plurality of memory regions.

7. The data processing device according to claim 1, wherein when the data processing device is powered on, the trimming data read control circuit randomly selects the random one of the plurality of memory regions.

8. The data processing device according to claim 1, wherein the nonvolatile memory further comprises a memory cell array comprising a predetermined memory region, which comprises the plurality of memory regions in which the same trimming data is stored.

9. The data processing device according to claim 1, wherein the nonvolatile memory further comprises the trimming data read control circuit.

10. The data processing device according to claim 1, wherein the trimming data read control circuit is configured to randomly select the random one of the plurality of memory regions from which to read the trimming data.

11. The data processing device according to claim 1, wherein each memory region of the plurality of memory regions is equally likely to be read from by the trimming data read control circuit.

12. The data processing device according to claim 1, wherein the nonvolatile memory further comprises a plurality of word lines each connected to a different memory region of the plurality of memory regions, and
  wherein when the trimming data read control circuit reads the trimming data from the random one of the plurality of memory regions, a read word line voltage is applied to a word line connected to the random one of the plurality of memory regions.

13. The data processing device according to claim 12, wherein when the read word voltage is applied to the word line connected to the random one the plurality of memory regions, the trimming data stored in each memory region of the plurality of memory regions other than the random one of the plurality of memory regions remain unaffected by the read word line voltage.

14. A data processing device comprising:
  a nonvolatile memory comprising a plurality of memory regions in which a same trimming data is stored;
  a trimming data read control circuit comprising:
    a region selection signal generation circuit configured to generate a region selection signal that specifies a random one memory region among said plurality of memory regions; and
    a read circuit configured to read said trimming data from said random one memory region in response to said region selection signal,
  wherein said region selection signal generation circuit comprises:
    a random number generation circuit configured to generate a random number; and
    a signal generation circuit configured to generate said region selection signal based on said generated random number.

* * * * *